United States Patent
Hiemstra

(12) 
(10) Patent No.: US 10,985,136 B2
(45) Date of Patent: Apr. 20, 2021

(54) MICROELECTRONIC DIE STACK HAVING AT LEAST ONE ROTATED MICROELECTRONIC DIE

(71) Applicant: INTEL CORPORATION, Santa Clara, CA (US)

(72) Inventor: Sheldon Hiemstra, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/347,261

(22) PCT Filed: Dec. 11, 2016

(86) PCT No.: PCT/US2016/066052
§ 371 (c)(1),
(2) Date: May 3, 2019

(87) PCT Pub. No.: WO2018/106266
PCT Pub. Date: Jun. 14, 2018

(65) Prior Publication Data
US 2019/0279959 A1 Sep. 12, 2019

(51) Int. Cl.
*H01L 23/48* (2006.01)
*H01L 23/52* (2006.01)
(Continued)

(52) U.S. Cl.
CPC ........ *H01L 25/0652* (2013.01); *H01L 24/09* (2013.01); *H01L 24/17* (2013.01);
(Continued)

(58) Field of Classification Search
CPC ....... H01L 2224/16225; H01L 25/0657; H01L 25/0652; H01L 25/074; H01L 25/0753
(Continued)

(56) References Cited

U.S. PATENT DOCUMENTS 6,563,205 B1 * 5/2003 Fogal ................. H01L 24/49
257/686
6,884,657 B1 4/2005 Fogal et al.
(Continued)

OTHER PUBLICATIONS

International Search Report and Written Opinion for PCT Application No. PCT/US16/66052, dated Sep. 11, 2017.
(Continued)

*Primary Examiner* — S. V. Clark
(74) *Attorney, Agent, or Firm* — Green, Howard & Mughal LLP.

(57) ABSTRACT

A microelectronic package may be fabricated having a microelectronic die stack attached to a microelectronic substrate, wherein the microelectronic die stack may include a first microelectronic die having an active surface and an opposing back surface, a first side and an opposing second side, wherein the first microelectronic die may include a plurality of primary bond pads on the active surface proximate the first side and at least one secondary bond pad on the active surface proximate the second side. The microelectronic die stack may further include a second microelectronic die having an active surface and an opposing back surface, wherein the back surface of the second microelectronic die is attached to the active surface of the first microelectronic die and wherein the second microelectronic die is rotated relative to the first microelectronic die to expose the at least one secondary bond pad of the first microelectronic die.

12 Claims, 5 Drawing Sheets

(51) Int. Cl.
*H01L 29/40* (2006.01)
*H01L 25/065* (2006.01)
*H01L 23/00* (2006.01)
*H01L 25/00* (2006.01)
*H01L 25/075* (2006.01)

(52) U.S. Cl.
CPC ............. *H01L 24/32* (2013.01); *H01L 24/33* (2013.01); *H01L 24/49* (2013.01); *H01L 24/73* (2013.01); *H01L 25/0657* (2013.01); *H01L 25/0756* (2013.01); *H01L 25/50* (2013.01); *H01L 24/48* (2013.01); *H01L 2224/05554* (2013.01); *H01L 2224/32145* (2013.01); *H01L 2224/48091* (2013.01); *H01L 2224/73265* (2013.01); *H01L 2225/0651* (2013.01); *H01L 2225/06506* (2013.01); *H01L 2225/06562* (2013.01); *H01L 2924/00014* (2013.01); *H01L 2924/14* (2013.01); *H01L 2924/1433* (2013.01); *H01L 2924/1434* (2013.01)

(58) Field of Classification Search
USPC ......... 257/686, 777; 438/107, 108, 109, 110
See application file for complete search history.

(56) References Cited

U.S. PATENT DOCUMENTS

| | | | |
|---|---|---|---|
| 6,900,528 B2* | 5/2005 | Mess | H01L 23/3128 257/686 |
| 7,262,506 B2* | 8/2007 | Mess | H01L 23/49575 257/686 |
| 7,375,419 B2* | 5/2008 | Mess | H01L 23/3128 257/686 |
| 8,399,973 B2* | 3/2013 | Oh | G11C 5/02 257/686 |
| 2003/0183917 A1 | 10/2003 | Tsai et al. | |
| 2009/0001574 A1 | 1/2009 | Fang et al. | |
| 2010/0148331 A1* | 6/2010 | Mess | H01L 23/49575 257/676 |
| 2011/0108995 A1 | 5/2011 | Nah et al. | |
| 2012/0001347 A1 | 1/2012 | Lee et al. | |
| 2012/0025396 A1* | 2/2012 | Liao | H01L 24/49 257/777 |

OTHER PUBLICATIONS

International Preliminary Report on Patentability for PCT Application No. PCT/US16/66052, dated Jun. 20, 2019.

* cited by examiner

MICROELECTRONIC DIE STACK HAVING AT LEAST ONE ROTATED MICROELECTRONIC DIE

CLAIM OF PRIORITY

This Application is a National Stage Entry of, and claims priority to, PCT Application No. PCT/US16/66052, filed on Dec. 11, 2016 and titled "MICROELECTRONIC DIE STACK HAVING AT LEAST ONE ROTATED MICROELECTRIC DIE", which is incorporated by reference in its entirety for all purposes.

TECHNICAL FIELD

Embodiments of the present description generally relate to the field of microelectronic packaging, and, more particularly, to a microelectronic packages having at least one microelectronic die stack.

BACKGROUND

The microelectronic industry is continually striving to produce ever faster, smaller, and thinner microelectronic packages for use in various electronic products, including, but not limited to, computer server products and portable products, such as wearable microelectronic systems, portable computers, electronic tablets, cellular phones, digital cameras, and the like.

One way to achieve these goals is by increasing integration density, such as by stacking components within the microelectronic package. One stacking method may comprise a method typically used in NAND memory die stacking, wherein a plurality of wirebond pads are formed along one edge of each of the NAND memory dice. The NAND memory dice are stacked on a microelectronic substrate in a staggered or zig-zag configuration to allow access to the wirebond pads. Bond wires are then used to form electrical connections between the wirebond pads on various NAND memory dice and/or between the NAND memory dice and the microelectronic substrate. Although this stacking method allows for flexibility and choice in wirebond pad location, the longest distance for a transmission line to a corresponding wirebond pad location within each NAND memory die may be the entire length of the NAND memory die. This may result in signal degradation due to impedance.

Another stacking method may comprise the use of through-silicon vias wherein signal lines are formed in and through the stacked NAND memory dice to form connections therebetween, as will be understood to those skilled in the art. Through-silicon vias allow for very short conductor paths between the NAND memory dice and the microelectronic substrate, as longest distance for a transmission line to a corresponding wirebond pad location within each NAND memory die may be a fraction of the length of the NAND memory die. However, the use of through-silicon vias requires an increased number of expensive wafer level processing steps, and may cause reliability issues from copper processing temperature, volume expansion during annealing, and ion migration. Further, the use of through-silicon vias does not allow for flexibility in the positioning of the through-silicon vias within the individual microelectronic dice, as the connection must be made straight down through the microelectronic die stack.

Therefore, there is a need to develop novel microelectronic die stacking configurations and designs to reduce signal transmission lengths, minimize costs, and improve reliability.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
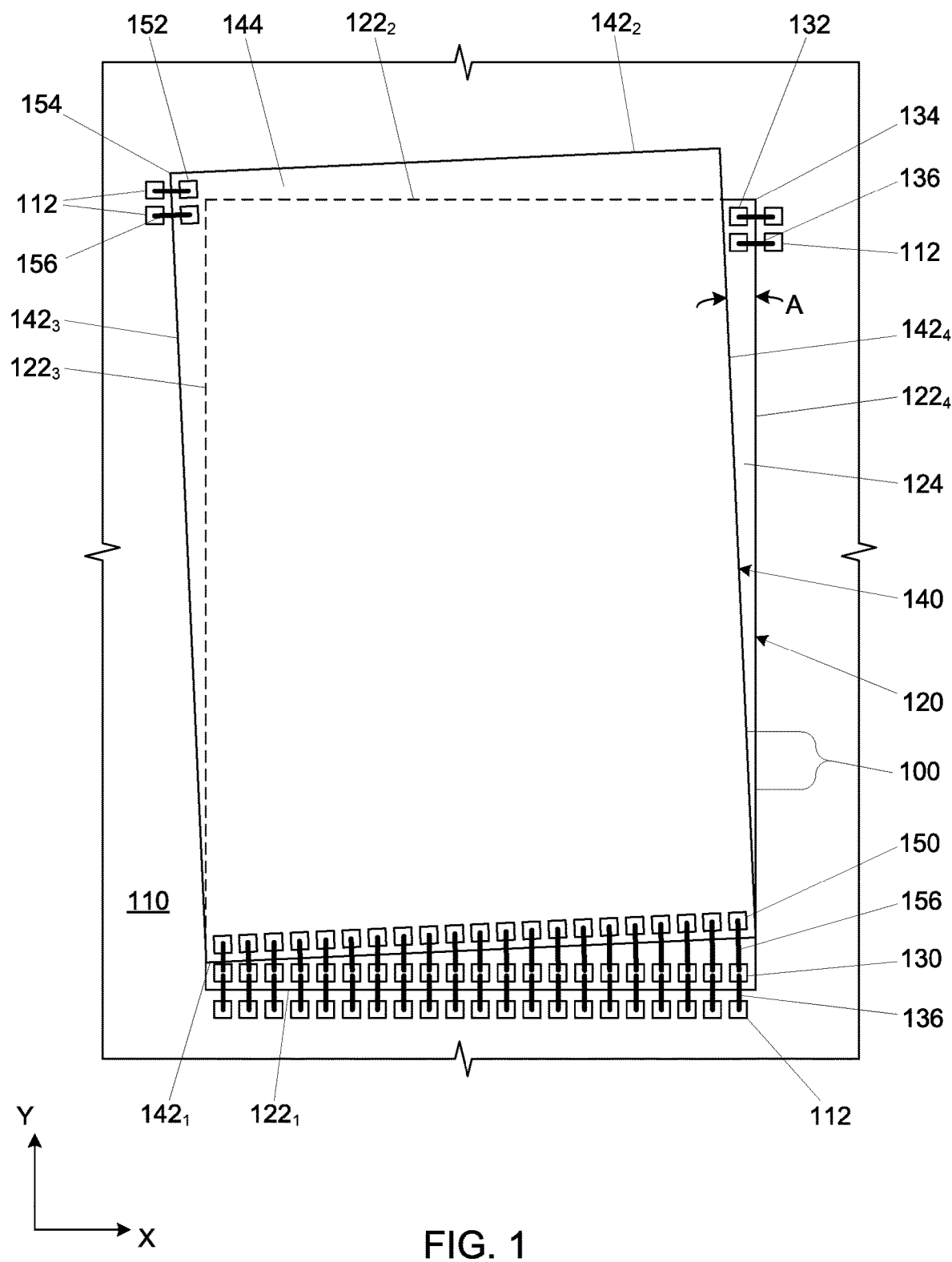
FIG. 1 illustrates a top plan view of a microelectronic die stack on a microelectronic substrate, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description may include a microelectronic package having a microelectronic die stack attached to a microelectronic substrate wherein the microelectronic die stack may include a first microelectronic die having an active surface and an opposing back surface, a first side and an opposing second side, wherein the first microelectronic die may include a plurality of primary bond pads on the active surface proximate the first side and at least one secondary bond pad on the active surface proximate the second side. The microelectronic die stack may further include a second microelectronic die having an active surface and an opposing back surface, wherein the back surface of the second microelectronic die is attached to the active surface of the first microelectronic die and wherein the second microelectronic die is rotated relative to the first microelectronic die to expose the at least one secondary bond pad of the first microelectronic die.

FIG. 1 illustrates a first microelectronic die 120 attached to a microelectronic substrate 110. The first microelectronic die 120 may have a first side $122_1$ and an opposing second side $122_2$, and may have a third side $122_3$ and an opposing fourth side $122_4$. As illustrated, the first microelectronic die first side $122_1$ and the first microelectronic die second side $122_2$ may extend parallel to an X-axis, and the first microelectronic die third side $122_3$ and the first microelectronic die fourth side $122_4$ may extend parallel to a Y-axis. The first microelectronic die 120 may have an active surface 124 with a plurality of primary bond pads 130 formed in or on the first microelectronic die active surface 124 proximate the first microelectronic die first side $122_1$, and at least one secondary bond pad 132 formed in or on the first microelectronic die active surface 124 proximate the first microelectronic die second side $122_2$. As illustrated, the at least one secondary bond pad 132 may be positioned proximate a corner 134 formed by the convergence of the first microelectronic die second side $122_2$ and the first microelectronic die fourth side $122_4$. The first microelectronic die primary bond pads 130 and the first microelectronic die secondary bond pads 132 may be in electrical communication with integrated circuitry (not shown) within the first microelectronic die 120.

As further shown in FIG. 1, a second microelectronic die 140 may be stacked on and attached to the first microelectronic die active surface 124, thereby forming a microelectronic die stack 100. The second microelectronic die 140 may have a first side $142_1$ and an opposing second side $142_2$, and may have a third side $142_3$ and an opposing fourth side $142_4$. The second microelectronic die 140 may have an active surface 144 with a plurality of primary bond pads 150 formed in or on the second microelectronic die active surface 144 proximate the second microelectronic die first side $142_1$. The second microelectronic die 140 may be positioned such that the second microelectronic die first side $142_1$ is adjacent the first microelectronic die first side $122_1$, the second microelectronic die second side $142_2$ is adjacent the first microelectronic die second side $122_2$, the second microelectronic die third side $142_3$ is adjacent the first microelectronic die third side $122_3$, and the second microelectronic die fourth side $142_4$ is adjacent the first microelectronic die fourth side $122_4$. As illustrated, the second microelectronic die 140 may be staggered with regard to the first microelectronic die 120, such that the second microelectronic die first side $142_1$ is offset from the first microelectronic die first side $122_1$ to expose the first microelectronic die primary bond pads 130. As further illustrated, the second microelectronic die 140 is rotated along the X-Y plane to expose the at least one first microelectronic die secondary bond pads 132, such that an angle A is formed between the first microelectronic die fourth side $122_4$ and the second microelectronic die fourth side $142_4$. In one embodiment, the angle A is less than about 45 degrees. In a specific embodiment, the angle A is between about 45 and 0.5 degrees.

In one embodiment, the second microelectronic die may have at least one secondary bond pad 152 formed in or on the second microelectronic die active surface 144 proximate the second microelectronic die second side $142_2$. As illustrated, the at least one secondary bond pad 152 may be positioned proximate a corner 154 formed by the convergence of the second microelectronic die second side $142_2$ and the second microelectronic die third side $142_3$. The second microelectronic die primary bond pads 150 and the second microelectronic die secondary bond pads 152 may be in electrical communication with integrated circuitry (not shown) within the second microelectronic die 140.

As further shown in FIG. 1, bond wires may be attached between the primary and secondary bond pads of the microelectronic dice and the microelectronic substrate. As shown, bond pads 112 on or in the microelectronic substrate 110 may be connected to respective first microelectronic die primary bond pads 130 and to respective first microelectronic die secondary bond pads 132 with first level bond wires 136. Second level bond wires 156 may connect the first microelectronic die primary bond pads 130 to respective second microelectronic die primary bond pads 150, and may connect the second microelectronic die secondary bond pads 152 to respective microelectronic substrate bond pads 112.

Figure 2:
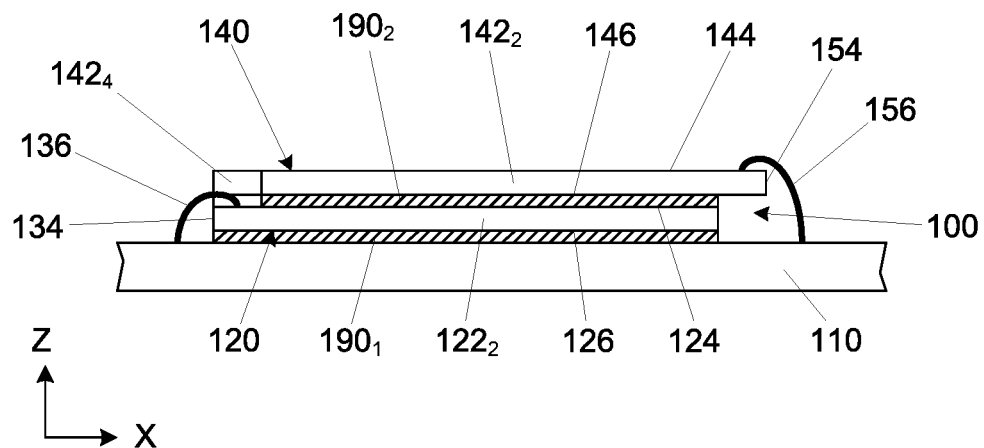
FIG. 2 illustrates a side view along line 2-2 for FIG. 1, according to one embodiment of the present description.

FIG. 2 is a side view along line 2-2 of FIG. 1, which illustrates the bond wire attachments (bond wires 136 and 156) and rotated the configuration at the first microelectronic die second side $122_2$ and the second microelectronic die second side $142_2$. This view more clearly illustrates that a back surface 126 of the first microelectronic die 120 may be attached to the microelectronic substrate 110, such as by a first adhesive layer 190_1, and that a back surface 146 of the second microelectronic die 140 may be attached to the first microelectronic die active surface 122, such as by a second adhesive layer 190_2.

Figure 3:
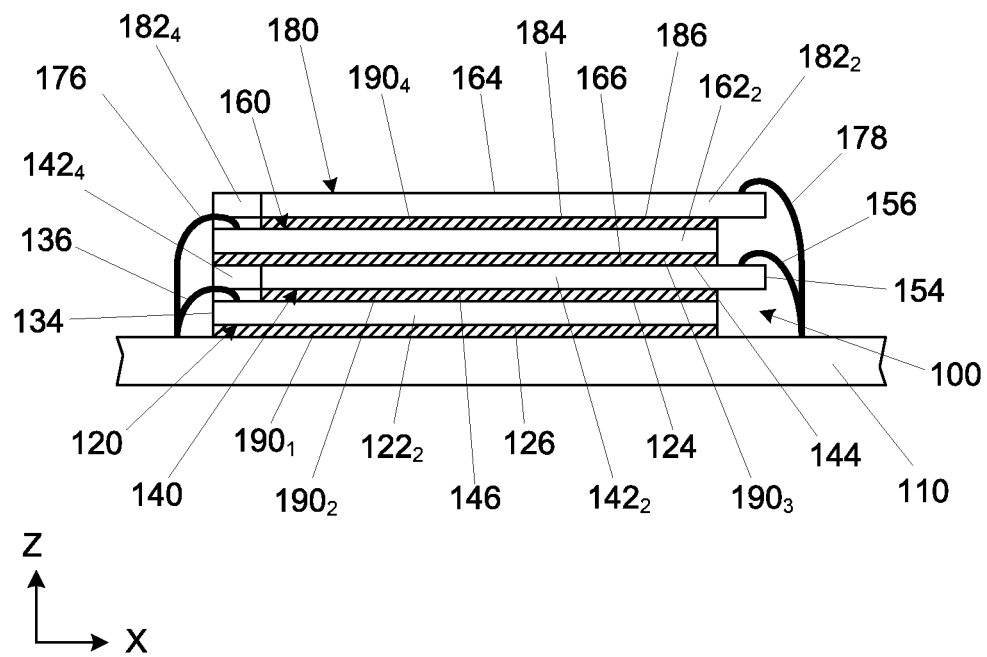
FIG. 3 illustrates a side view of a microelectronic die stack on a microelectronics substrate, according to another embodiment of the present description.

It is understood that embodiments of the present description are not limited to any particular number of stacked microelectronic dice, nor limited to any specific bond wire arrangement or attachment configuration. As shown in FIG. 3, any number of microelectronic dice may be stacked with the alternating non-rotated/rotated configuration of the present description. In specific, FIG. 3 illustrates a non-rotated third microelectronic die 160 attached by its back surface 166 to the second microelectronic die active surface 124 by a third adhesive layer 190_3, and a rotated fourth microelectronic die 180 attached by its back surface 186 to an active surface 164 of the third microelectronic die 160 by a fourth adhesive layer 190_4. At least one secondary bond pad (not specifically illustrated) on or in the active surface 164 of the third microelectronic die 160 may be connected to the microelectronic substrate 110 with a third level bond wire 176, and at least one secondary bond pad (not specifically illustrated) on or in an active surface 184 of the fourth microelectronic die 180 may be connected to the microelectronic substrate 110 with a fourth level bond wire 178. It is understood that the third microelectronic die 160 and the fourth microelectronic die 180 may have analogous structures to the first microelectronic die 120 and the second microelectronic die 140, such as the illustrated structures of a fourth side 1624 of the third microelectronic die 160, and a fourth side 1824 of the fourth microelectronic die 180.

Figure 4:
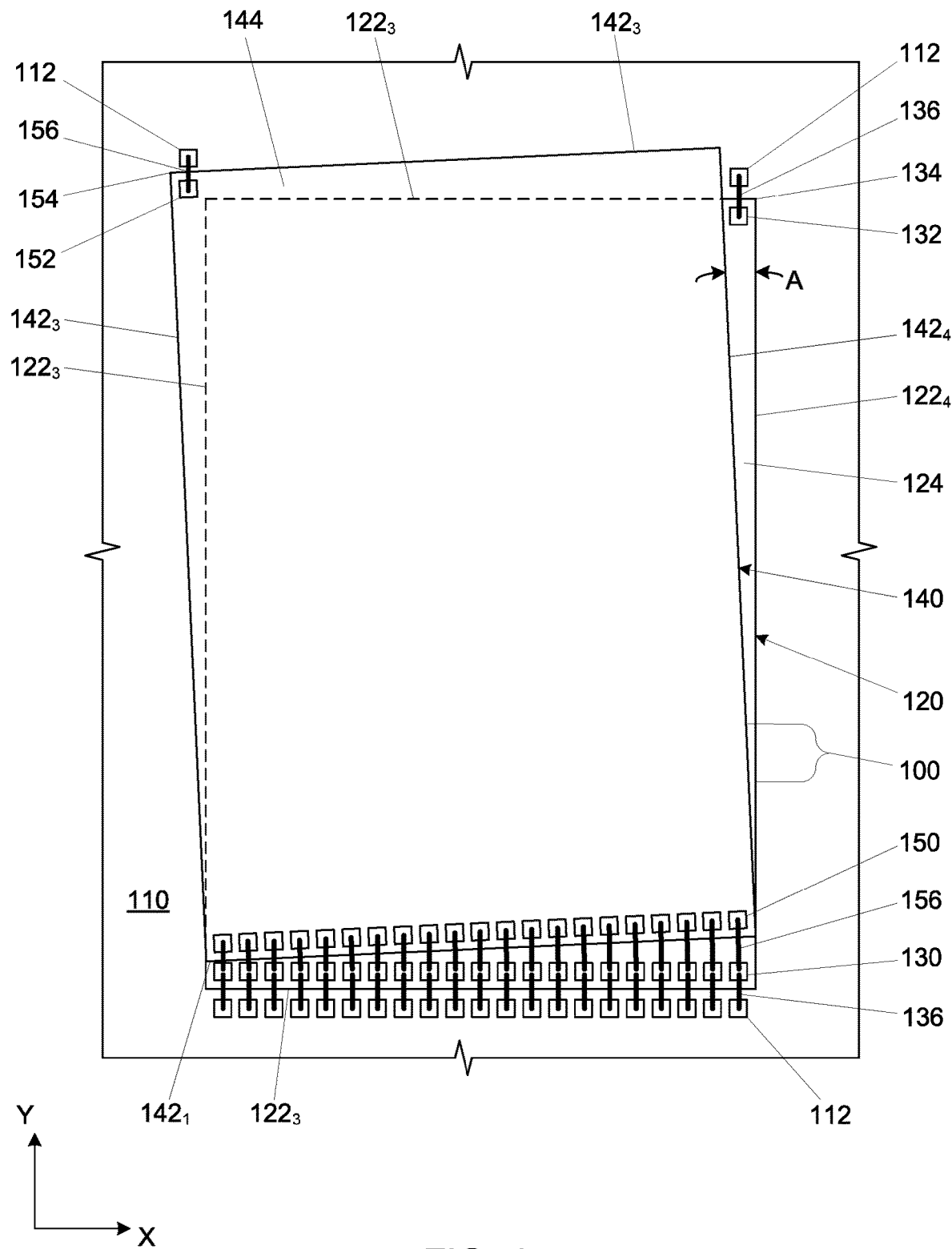
FIG. 4 illustrates a top plan view of a microelectronic die stack on a microelectronic substrate, according to still another embodiment of the present description.

It is further understood that embodiments of the present description are not limited to any specific bond wire arrangement or attachment configuration. For example, as shown in FIG. 4, the first level wire bond 172 connecting the first microelectronic die secondary bond pad 132 to the respective microelectronic substrate bond pads 112, and/or the second level bond wire 174 connecting the second microelectronic die secondary bond pad 152 to the respective microelectronic substrate bond pads 112 may be oriented in a direction parallel to the Y-axis rather than being oriented in a direction parallel to the X-axis, as shown in FIG. 1.

The microelectronic substrate 110 may comprise any appropriate dielectric material, including, but not limited to, liquid crystal polymer, epoxy resin, bismaleimide triazine resin, FR4, polyimide materials, and the like, and may include conductive routes (not shown) formed therein and/or thereon to form any desired electrical route within the microelectronic substrate 110. The first microelectronic die 120, the second microelectronic die 140, the third microelectronic die 160, and/or the fourth microelectronic die 180, may be any appropriate microelectronic device, including, but not limited to, microprocessors, chipsets, graphics devices, wireless devices, memory devices, application specific integrated circuit devices, and the like. In a specific embodiment, the first microelectronic die 120, the second microelectronic die 140, the third microelectronic die 160, and/or the fourth microelectronic die 180, may be non-volatile memory devices.

Figure 5:
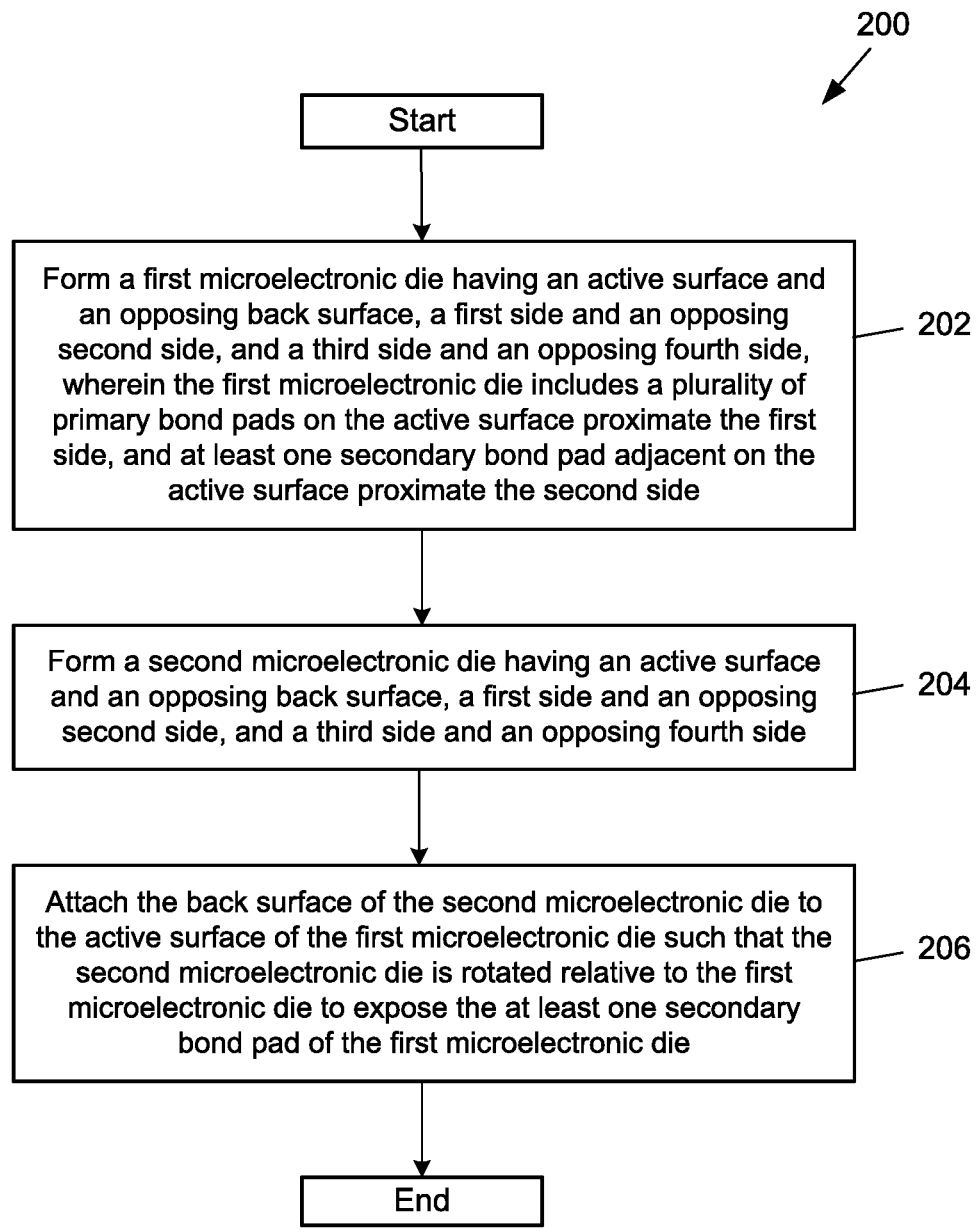
FIG. 5 is a flow diagram of a process of fabricating a microelectronic structure, according to an embodiment of the present description.

FIG. 5 is a flow chart of a process 200 of fabricating a microelectronic structure according to an embodiment of the present description. As set forth in block 202, a first microelectronic die may be formed having an active surface and an opposing back surface, a first side and an opposing second side, and a third side and an opposing fourth side, wherein the first microelectronic die includes a plurality of primary bond pads on the active surface proximate the first side, and at least one secondary bond pad on the active surface proximate the second side. A second microelectronic die may be formed having an active surface and an opposing back surface, a first side and an opposing second side, and a third side and an opposing fourth side, as set forth in block 204. As set forth in block 206, the back surface of the second microelectronic die may be attached to the active surface of the first microelectronic die such that the second microelectronic die is rotated relative to the first microelectronic die to expose the at least one secondary bond pad of the first microelectronic die.

Figure 6:
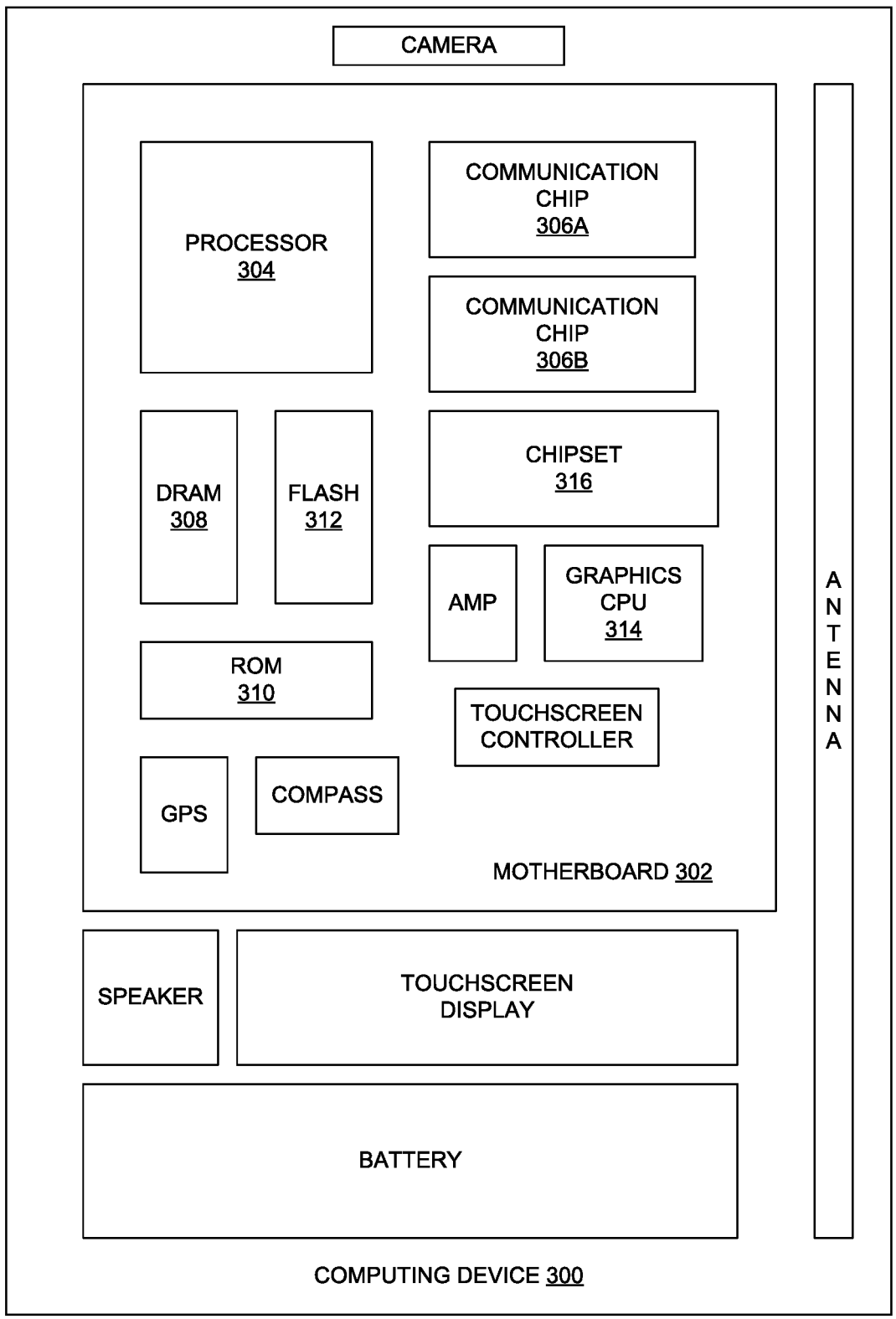
FIG. 6 illustrates a computing device in accordance with one implementation of the present description.

FIG. 6 illustrates a computing device 300 in accordance with one implementation of the present description. The computing device 300 houses a board 302. The board may include a number of microelectronic components, including but not limited to a processor 404, at least one communication chip 306A, 306B, volatile memory 308, (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 302. In some implementations, at least one of the microelectronic components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 300 may include a microelectronic package having a microelectronic die stack attached to microelectronic substrate, wherein the microelectronic die stack may include a first microelectronic die having an active surface and an opposing back surface, a first side and an opposing second side, wherein the first microelectronic die may include a plurality of primary bond pads on the active surface proximate the first side and at least one secondary bond pad on the active surface proximate the second side. The microelectronic die stack may further include a second microelectronic die having an active surface and an opposing back surface, wherein the back surface of the second microelectronic die is attached to the active surface of the first microelectronic die and wherein the second microelectronic die is rotated relative to the first microelectronic die to expose the at least one secondary bond pad of the first microelectronic die.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-6. The subject matter may be applied to other microelectronic devices and assembly applications, as well as any appropriate electronic application, as will be understood to those skilled in the art.

The follow examples pertain to further embodiments and specifics in the examples may be used anywhere in one or more embodiments, wherein Example 1 is a microelectronic structure, comprising a first microelectronic die having an active surface and an opposing back surface, a first side and an opposing second side, and a third side and an opposing fourth side, wherein the first microelectronic die includes a plurality of primary bond pads on the active surface proximate the first side, and at least one secondary bond pad on the active surface proximate the second side; and a second microelectronic die having an active surface and an opposing back surface, a first side and an opposing second side, and a third side and an opposing fourth side, wherein the back surface of the second microelectronic die is attached to the active surface of the first microelectronic die and the second microelectronic die is rotated relative to the first microelectronic die to expose the at least one secondary bond pad of the first microelectronic die.

In Example 2, the subject matter of Example 1 can optionally include the back surface of the second microelectronic die is attached to the active surface of the first microelectronic die in a position to expose the primary bond pads of the first microelectronic die.

In Example 3, the subject matter of any of Examples 1 and 2 can optionally include the second microelectronic die being rotated relative to the first microelectronic die comprises the fourth side of the second microelectronic die being rotated relative to the fourth side of the first microelectronic die to form an angle of less than about 45 degrees.

In Example 4, the subject matter of any of Examples 1 to 3 can optionally include a microelectronic substrate having plurality of bond pads formed in or on the microelectronic substrate, wherein the back surface of the first microelectronic die is attached to the microelectronic substrate.

In Example 5, the subject matter of Example 4 can optionally include a plurality of first level bond wires extending between the microelectronic substrate bond pads and corresponding primary bond pads and secondary bond pads of the first microelectronic die.

In Example 6, the subject matter of any of Examples 1 to 5 can optionally include the second microelectronic die including a plurality of primary bond pads on the active surface proximate the first side, and at least one secondary bond pad on the active surface proximate the second side.

In Example 7, the subject matter of Example 6 can optionally include a plurality of second level bond wires extending between the microelectronic substrate bond pads and corresponding secondary bond pads of the second microelectronic die.

In Example 8, the subject matter of any of Examples 1 to 7 can optionally include a third microelectronic die attached to the second microelectronic die, wherein the third microelectronic die is not rotated relative to the first microelectronic die; and further including a fourth microelectronic die attached to the third microelectronic die, wherein the fourth microelectronic die is rotated relative to the first microelectronic die.

In Example 9, a method of fabricating a microelectronic structure may comprise providing a first microelectronic die having an active surface and an opposing back surface, a first side and an opposing second side, and a third side and an opposing fourth side, wherein the first microelectronic die includes a plurality of primary bond pads on the active surface proximate the first side, and at least one secondary bond pad on the active surface proximate the second side; providing a second microelectronic die having an active surface and an opposing back surface, a first side and an opposing second side, and a third side and an opposing fourth side; and attaching the back surface of the second microelectronic die to the active surface of the first microelectronic die such that the second microelectronic die is rotated relative to the first microelectronic die to expose the at least one secondary bond pad of the first microelectronic die.

In Example 10, the subject matter of Example 9 can optionally include the back surface of the second microelectronic die being attached to the active surface of the first microelectronic die in a position to expose the primary bond pads of the first microelectronic die.

In Example 11, the subject matter of any of Examples 9 and 10 can optionally include the second microelectronic die being rotated relative to the first microelectronic die comprises the fourth side of the second microelectronic die being rotated relative to the fourth side of the first microelectronic die to form an angle of less than about 45 degrees.

In Example 12, the subject matter of any of Examples 9 to 11 can optionally include forming a microelectronic substrate having plurality of bond pads formed in or on the microelectronic substrate and attaching the back surface of the first microelectronic die to the microelectronic substrate.

In Example 13, the subject matter of Example 12 can optionally include forming a plurality of first level bond wires extending between the microelectronic substrate bond pads and corresponding primary bond pads and secondary bond pads of the first microelectronic die.

In Example 14, the subject matter of any of Examples 9 to 13 can optionally include forming the second microelectronic die comprising forming the second microelectronic die including a plurality of primary bond pads on the active surface proximate the first side, and at least one secondary bond pad on the active surface proximate the second side.

In Example 15, the subject matter of any of Example 14 can optionally include forming a plurality of second level bond wires extending between the microelectronic substrate bond pads and corresponding secondary bond pads of the second microelectronic die.

In Example 16, the subject matter of any of Examples 9 to 15 can optionally include forming a third microelectronic die and attaching the third microelectronic die to the second microelectronic die, wherein the third microelectronic die is not rotated relative to the first microelectronic die; and further including forming a fourth microelectronic die and attaching the fourth microelectronic die to the third microelectronic die, wherein the fourth microelectronic die is rotated relative to the first microelectronic die.

In Example 17, an electronic system may comprise a board; and a microelectronic package attached to the board, wherein the microelectronic package includes a first microelectronic die having an active surface and an opposing back surface, a first side and an opposing second side, and a third side and an opposing fourth side, wherein the first microelectronic die includes a plurality of primary bond pads on the active surface proximate the first side, and at least one secondary bond pad on the active surface proximate the second side; and a second microelectronic die having an active surface and an opposing back surface, a first side and an opposing second side, and a third side and an opposing fourth side, wherein the back surface of the second microelectronic die is attached to the active surface of the first microelectronic die and the second microelectronic die is rotated relative to the first microelectronic die to expose the at least one secondary bond pad of the first microelectronic die.

In Example 18, the subject matter of Example 17 can optionally include the back surface of the second microelectronic die is attached to the active surface of the first microelectronic die in a position to expose the primary bond pads of the first microelectronic die.

In Example 19, the subject matter of any of Examples 17 and 18 can optionally include the second microelectronic die being rotated relative to the first microelectronic die comprises the fourth side of the second microelectronic die being rotated relative to the fourth side of the first microelectronic die to form an angle of less than about 45 degrees.

In Example 20, the subject matter of any of Examples 17 to 19 can optionally include a microelectronic substrate having plurality of bond pads formed in or on the microelectronic substrate, wherein the back surface of the first microelectronic die is attached to the microelectronic substrate.

In Example 21, the subject matter of Example 20 can optionally include a plurality of first level bond wires extending between the microelectronic substrate bond pads and corresponding primary bond pads and secondary bond pads of the first microelectronic die.

In Example 22, the subject matter of any of Examples 17 to 21 can optionally include the second microelectronic die including a plurality of primary bond pads on the active surface proximate the first side, and at least one secondary bond pad on the active surface proximate the second side.

In Example 23, the subject matter of Example 22 can optionally include a plurality of second level bond wires extending between the microelectronic substrate bond pads and corresponding secondary bond pads of the second microelectronic die.

In Example 24, the subject matter of any of Examples 17 to 23 can optionally include a third microelectronic die attached to the second microelectronic die, wherein the third microelectronic die is not rotated relative to the first microelectronic die; and further including a fourth microelectronic die attached to the third microelectronic die, wherein the fourth microelectronic die is rotated relative to the first microelectronic die.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic structure, comprising:
    a first microelectronic die having an active surface and an opposing back surface, a first side and an opposing second side, and a third side and an opposing fourth side, wherein the first microelectronic die includes a plurality of primary bond pads on the active surface proximate the first side, and at least one secondary bond pad on the active surface proximate the second side;
    a second microelectronic die having an active surface and an opposing back surface, a first side and an opposing second side, and a third side and an opposing fourth side, wherein the second microelectronic die includes a plurality of primary bond pads on the active surface proximate the first side, and at least one secondary bond pad on the active surface proximate the second side;
    a microelectronic substrate having plurality of bond pads formed in or on the microelectronic substrate, wherein the back surface of the first microelectronic die is attached to the microelectronic substrate;
    wherein the back surface of the second microelectronic die is attached to the active surface of the first microelectronic die and the second microelectronic die is rotated relative to the first microelectronic die to expose the at least one secondary bond pad of the first microelectronic die;
    a plurality of bond wires extending between the primary bond pads of the first microelectronic die and the primary bond pads of the second microelectronic die, wherein the primary bond pads of the second microelectronic die are only electrically attached to the primary bond pads of the first microelectronic die;
    a plurality of first level bond wires extending between the microelectronic substrate bond pads and corresponding primary bond pads and secondary bond pads of the first microelectronic die; and
    a plurality of second level bond wires extending between the microelectronic substrate bond pads and corresponding secondary bond pads of the second microelectronic die.

2. The microelectronic structure of claim 1, wherein the back surface of the second microelectronic die is attached to the active surface of the first microelectronic die in a position to expose the primary bond pads of the first microelectronic die.

3. The microelectronic structure of claim 1, wherein the second microelectronic die being rotated relative to the first microelectronic die comprises the fourth side of the second microelectronic die being rotated relative to the fourth side of the first microelectronic die to form an angle of less than about 45 degrees.

4. The microelectronic structure of claim 1, further including a third microelectronic die attached to the second microelectronic die, wherein the third microelectronic die is not rotated relative to the first microelectronic die; and further including a fourth microelectronic die attached to the third microelectronic die, wherein the fourth microelectronic die is rotated relative to the first microelectronic die.

5. A method of fabricating a microelectronic structure, comprising:
    forming a first microelectronic die having an active surface and an opposing back surface, a first side and an opposing second side, and a third side and an opposing fourth side, wherein the first microelectronic die includes a plurality of primary bond pads on the active surface proximate the first side, and at least one secondary bond pad on the active surface proximate the second side;
    forming a second microelectronic die having an active surface and an opposing back surface, a first side and an opposing second side, and a third side and an opposing fourth side, wherein the second microelectronic die includes a plurality of primary bond pads on the active surface proximate the first side, and at least one secondary bond pad on the active surface proximate the second side;
    attaching the back surface of the second microelectronic die to the active surface of the first microelectronic die such that the second microelectronic die is rotated relative to the first microelectronic die to expose the at least one secondary bond pad of the first microelectronic die;

forming a microelectronic substrate having plurality of bond pads formed in or on the microelectronic substrate, wherein the back surface of the first microelectronic die is attached to the microelectronic substrate;

forming a plurality of bond wires extending between the primary bond pads of the first microelectronic die and the primary bond pads of the second microelectronic die, wherein the primary bond pads of the second microelectronic die are only electrically attached to the primary bond pads of the first microelectronic die;

forming a plurality of first level bond wires extending between the microelectronic substrate bond pads and corresponding primary bond pads and secondary bond pads of the first microelectronic die; and forming a plurality of second level bond wires extending between the microelectronic substrate bond pads and corresponding secondary bond pads of the second microelectronic die.

6. The method of claim 5, wherein the back surface of the second microelectronic die is attached to the active surface of the first microelectronic die in a position to expose the primary bond pads of the first microelectronic die.

7. The method of claim 5, wherein the second microelectronic die being rotated relative to the first microelectronic die comprises the fourth side of the second microelectronic die being rotated relative to the fourth side of the first microelectronic die to form an angle of less than about 45 degrees.

8. The method of claim 5, further including forming a third microelectronic die and attaching the third microelectronic die to the second microelectronic die, wherein the third microelectronic die is not rotated relative to the first microelectronic die; and further including forming a fourth microelectronic die and attaching the fourth microelectronic die to the third microelectronic die, wherein the fourth microelectronic die is rotated relative to the first microelectronic die.

9. An electronic system, comprising:

a board; and a microelectronic package attached to the board, wherein the microelectronic package includes:

a first microelectronic die having an active surface and an opposing back surface, a first side and an opposing second side, and a third side and an opposing fourth side, wherein the first microelectronic die includes a plurality of primary bond pads on the active surface proximate the first side, and at least one secondary bond pad on the active surface proximate the second side;

a second microelectronic die having an active surface and an opposing back surface, a first side and an opposing second side, and a third side and an opposing fourth side, wherein the second microelectronic die includes a plurality of primary bond pads on the active surface proximate the first side, and at least one secondary bond pad on the active surface proximate the second side;

a microelectronic substrate having plurality of bond pads formed in or on the microelectronic substrate, wherein the back surface of the first microelectronic die is attached to the microelectronic substrate;

wherein the back surface of the second microelectronic die is attached to the active surface of the first microelectronic die and the second microelectronic die is rotated relative to the first microelectronic die to expose the at least one secondary bond pad of the first microelectronic die;

a plurality of bond wires extending between the primary bond pads of the first microelectronic die and the primary bond pads of the second microelectronic die, wherein the primary bond pads of the second microelectronic die are only electrically attached to the primary bond pads of the first microelectronic die;

a plurality of first level bond wires extending between the microelectronic substrate bond pads and corresponding primary bond pads and secondary bond pads of the first microelectronic die; and a plurality of second level bond wires extending between the microelectronic substrate bond pads and corresponding secondary bond pads of the second microelectronic die.

10. The electronic system of claim 9, wherein the back surface of the second microelectronic die is attached to the active surface of the first microelectronic die in a position to expose the primary bond pads of the first microelectronic die.

11. The electronic system of claim 9, wherein the second microelectronic die being rotated relative to the first microelectronic die comprises the fourth side of the second microelectronic die being rotated relative to the fourth side of the first microelectronic die to form an angle of less than about 45 degrees.

12. The electronic system of claim 9, further including a third microelectronic die attached to the second microelectronic die, wherein the third microelectronic die is not rotated relative to the first microelectronic die; and further including a fourth microelectronic die attached to the third microelectronic die, wherein the fourth microelectronic die is rotated relative to the first microelectronic die.

* * * * *